(12) United States Patent
Tsai

(10) Patent No.: US 6,887,748 B1
(45) Date of Patent: May 3, 2005

(54) MIXED-MODE PROCESS

(75) Inventor: Ching-Huei Tsai, Hsin-Chu (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 10/708,108

(22) Filed: Feb. 10, 2004

(51) Int. Cl.[7] .................. H01L 21/336; H01L 21/8242; H01L 21/425

(52) U.S. Cl. .................. 438/197; 438/239; 438/514

(58) Field of Search .................. 438/197, 238, 438/239, 253, 396, 301, 510, 514

(56) References Cited

U.S. PATENT DOCUMENTS 5,918,119 A * 6/1999 Huang .................. 438/238
6,156,602 A * 12/2000 Shao et al. .................. 438/238

* cited by examiner

Primary Examiner—David Zarneke
Assistant Examiner—Scott B. Geyer
(74) Attorney, Agent, or Firm—Winston Hsu

(57) ABSTRACT

A mixed-mode process comprises to provide a substrate first. A surface of the substrate comprises at least a first conductor in a first conductive region, at least a second conductor in a second conductive region, at least a metal-oxide-semiconductor (MOS) transistor in a MOS transistor region, and at least a capacitor in a capacitor region. A mask is then formed on the substrate to expose the second conductor. A first etching process is thereafter performed to remove a specific thickness of the second conductor followed by a first ion implantation process to dope the second conductor with the first type dopants.

16 Claims, 16 Drawing Sheets

MIXED-MODE PROCESS

BACKGROUND OF INVENTION

1. Field of the Invention

The present invention relates to a mixed-mode process, and more particularly, to a double poly mixed-mode process for forming a mixed-signal circuit embedded with a high resistance (HR) resistor.

2. Description of the Prior Art

In a semiconductor process, polysilicon is often positioned to function as resistors capable of providing various resistance values. High resistance resistors, which are widely used in the SRAM, analog, digital/analog mixed-mode, and radio frequency circuit designs, attract many major manufacturers to devote themselves in developing. When load transistors of a static random access memory (SRAM) is replaced by polysilicon resistors, the number of transistors in the SRAM can be reduced and thus saves cost and enhance the integration of the SRAM. Only when the polysilicon resistor is capable of providing a uniform and stable value of high resistance, the requirements for various circuit designs can be satisfied and to be carried out.

Please refer to FIG. 1 to FIG. 7. FIG. 1 to FIG. 7 are schematic diagrams illustrating a mixed-mode process according to the prior art method. As shown in FIG. 1, a semiconductor substrate 10 is provided first. The semiconductor substrate 10 has a surface comprising at least a first conductive region 12, at least a second conductive region 14, at least a metal-oxide-semiconductor (MOS) transistor region 16, and at least a capacitor region 18. Either portions of the surface of the semiconductor substrate 10 within the first conductive region 12, the second conductive region 14, or the capacitor region 18 further comprises a field oxide layer 22.

As shown in FIG. 2, a gate oxide layer 24 and a first polysilicon layer 26 are sequentially formed on the semiconductor substrate 10. The gate oxide layer 24 is formed by performing a thermal oxidation process, and the first polysilicon layer 26 is a doped polysilicon layer or an undoped polysilicon layer followed by an implantation process. In addition, a silicide layer (not shown) is optionally formed on the first polysilicon layer 26. The silicide layer (not shown), composed of tungsten silicide ($WSi_x$, where x=2.2~2.3), is formed by performing a sputtering process and a rapid thermal process (RTP). For simplicity of description, steps employed to form the silicide layer (not shown) are neglected. The silicide layer (not shown) is also regarded as a polycide layer because there is come reaction between the first polysilicon layer 26 and the silicide layer (not shown).

As shown in FIG. 3, a first photo-etching-process (PEP) is performed to remove portions of the silicide layer (not shown) and the first polysilicon layer 26 to simultaneously form a bottom electrode plate 32 of a capacitor (not shown) and a gate 34 of a MOS transistor (not shown) respectively within the capacitor region 18 and the MOS transistor region 16. After that, an interpolysilicon oxide (IPO) layer 36 and a second polysilicon layer 38 are sequentially formed on the semiconductor substrate 10 to cover the bottom electrode plate 32 of the capacitor (not shown) and the gate 34 of the MOS transistor (not shown). The second polysilicon layer 38 may be formed by a deposition process followed by an ion implantation process, or be formed by an in-situ doped chemical vapor deposition (CVD) process. The dopants utilized in the ion implantation process may be N-type dopants, such as arsenic or phosphorus, or P-type dopants, such as boron. When the dopants are N-type, the dosage of the ion implantation process is approximately $10^{14\sim16}$ atoms/cm$^2$. When the dopants are P-type, the dosage of the ion implantation process is approximately $10^{12\sim14}$ atoms/cm$^2$. If the second polysilicon layer 38 is formed by an in-situ doped chemical vapor deposition process, a mixing gas containing phosphine ($PH_3$) or arsine ($AsH_3$) or diborane ($B_2H_6$), silane ($SiH_4$), and nitrogen ($N_2$) is added into the reaction chamber to form the doped second polysilicon layer 38 in one step to achieve the equivalent result. Therefore, the second polysilicon layer 38 is doped with N-type dopants or P-type dopants.

As shown in FIG. 4, a second PEP is performed to remove portions of the second polysilicon layer 38 by utilizing the IPO layer 36 as a stop layer, to simultaneously form a first conductive wire 42, a second conductive wire 44, and a top electrode plate 46 of the capacitor (not shown) respectively within the first conductive region 12, the second conductive region 14, and the capacitor region 18. The IPO layer 36 not between the bottom electrode plate 32 and the top electrode plate 46, not below the first conductive wire 42 and the second conductive wire 44 is thereafter removed by a wet dip process, and the IPO layer 36 between the bottom electrode plate 32 and the top electrode plate 46 is employed as a capacitor dielectric layer 48 of the capacitor 52, as shown in FIG. 5. The conductive wires 42, 44 are optionally employed as resistors of the integration circuits depending on the layout of the integration circuits.

A dielectric layer (not shown), composed of tetra-ethyloxysilane (TEOS), is formed on the semiconductor substrate 10 to cover the first conductive wire 42, the second conductive wire 44, the gate 34, and the capacitor 52. By using surfaces of the field oxide layers 22 and the gate oxide layer 24 as a stop layer, a first etching process is performed to remove portions of the dielectric layer (not shown) to form a spacer 54 on either sides of the first conductive wire 42, a spacer 56 on either sides of the second conductive wire 44, a spacer 58 on either sides of the gate 34 of the MOS transistor (not shown), a spacer 62 on one side of the capacitor 52, and spacers 64, 66 on another side of the capacitor 52. It is worth noting that the spacers 64, 66 at one side of the capacitor 52 has a different shape from the other spacers 54, 56, 58, 62 owing to the unequal widths of the bottom electrode plate 32 and the top electrode plate 46 of the capacitor 52. In addition, an ion implantation process may be performed to form a lightly doped drain (LDD, not shown) in portions of the semiconductor substrate 10 adjacent to either sides of the gate 34 before the spacers 54, 56, 58, 62, 64, 66 are formed.

As shown in FIG. 6, a high resistance (HR) mask 72 is then formed on the semiconductor substrate 10. The HR mask 72 covers the capacitor 52, the first conductive wire 42, the gate 34 of the MOS transistor (not shown), and exposes the second conductive wire 44. After that, a first ion implantation process is performed to dope the second conductive wire 44 with dopants having an opposite type to the dopants used in doping the second polysilicon layer 38. That means, the second conductive wire 44 is doped with P-type dopants, such as boron, or N-type dopants, such as arsenic or phosphorus, when the dopants used in doping the second polysilicon layer 38 are N-type or P-type, respectively. The first ion implantation process is thus called a high resistance implantation process. When the dopants are P-type, the dosage of the first ion implantation process is approximately $10^{13-15}$ atoms/cm². When the dopants are N-type, the dosage of the first ion implantation process is approximately $10^{13-15}$ atoms/cm². No matter what type of dopant is utilized to dope the second polysilicon layer 38, the resultant dopant concentration is high. It is obvious that the dopant concentration achieved by the first ion implantation process is lower than the dopant concentration in the second polysilicon layer 38. Therefore, some of the dopants which already exist in the second conductive wire 44 are neutralized by the opposite type dopants doped by the first ion implantation process, and the not neutralized dopants in the second conductive wire 44 directly contribute to the resistance of the second conductive wire 46 to form a high resistance resistor. In contrast with the second conductive wire 44, the first conductive wire 42 which is not doped with opposite dopants is a low resistance resistor.

As shown in FIG. 7, the HR mask 72 is removed. After that, a source 74 and a drain 76 of the MOS transistor 78 are formed in portions of the semiconductor substrate 10 adjacent to but not contiguous to either sides of the gate 34, by performing a second implantation process, to complete the fabricating of the MOS transistor 78.

However, the dosage and/or implant energy of the high resistance implantation process reach a saturation status. That means, the resistance value of the high resistance resistor formed according to the prior art mixed-mode process can only reach to the order of thousands order since the neutralization ability of the high resistance implantation process is limited. In the modern electrical industry, such a resistance value is not high enough so that resistors having such a resistance value cannot fulfill the requirements for modern circuit designs. Moreover, the high dosage and/or implant energy of the high resistance implantation process tend to cause processing problems. Therefore, it is very important to develop a mixed-mode process to form the polysilicon resistor having a uniform and stable value of high resistance. At the same time, the new developed mixed-mode process should not add complexity to processing and cost to products due to any extra photolithography steps.

SUMMARY OF INVENTION

It is therefore a primary object of the present invention to provide a mixed-mode process for integration circuits (IC) to form the polysilicon resistor having a uniform and stable value of high resistance to revolve the above-mentioned problems.

According to the claimed invention, a mixed-mode process for integration circuits comprises to provide a semiconductor substrate first. A surface of the semiconductor substrate comprises at least a first conductor formed in a first conductive region, at least a second conductor formed in a second conductive region, at least a metal-oxide-semiconductor (MOS) transistor formed in a MOS transistor region, and at least a capacitor formed in a capacitor region. A mask is then formed on the semiconductor substrate to cover the MOS transistor, the first conductor, and the capacitor and to expose the second conductor. A first etching process is thereafter performed to remove a specific thickness of the second conductor. Finally, a first ion implantation process is performed to dope the second conductor with first type dopants.

It is an advantage of the present invention that the present invention provides a mixed-mode process to remove a specific thickness of the second conductive wire without adding any mask and photolithography step. Therefore, the thickness of the second conductive wire becomes smaller, leading to a smaller cross-section area of the second conductive wire. As a result, the second conductive wire becomes a resistor having a high resistance value. By adjusting the final thickness of the second conductive wire in conjunction with the dosage and/or implant energy of the high resistance implantation process, the ideal resistance value can be achieved. According to the present invention mixed-mode process, a high resistance resistor having a double or even higher resistance value of that of the prior art is fabricated, even though the HR implantation process cannot effectively neutralize the dopants already existing in the second conductive wire. Furthermore, the dosage and/or the implant energy of the HR implantation process can be reduced to avoid processing problems caused by high implant dosage and high implant energy.

These and other objectives of the present invention will no doubt become obvious to those of ordinary skill in the art after reading the following detailed description of the preferred embodiment, which is illustrated in the multiple figures and drawings.

DETAILED DESCRIPTION

Figure 1:
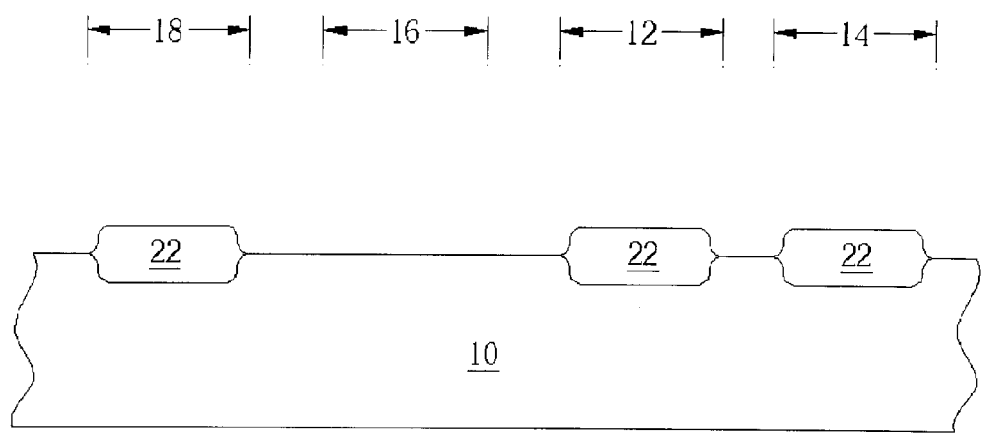
FIG. 1 to FIG. 7 are schematic diagrams illustrating a mixed-mode process according to the prior art method.
Figure 2:
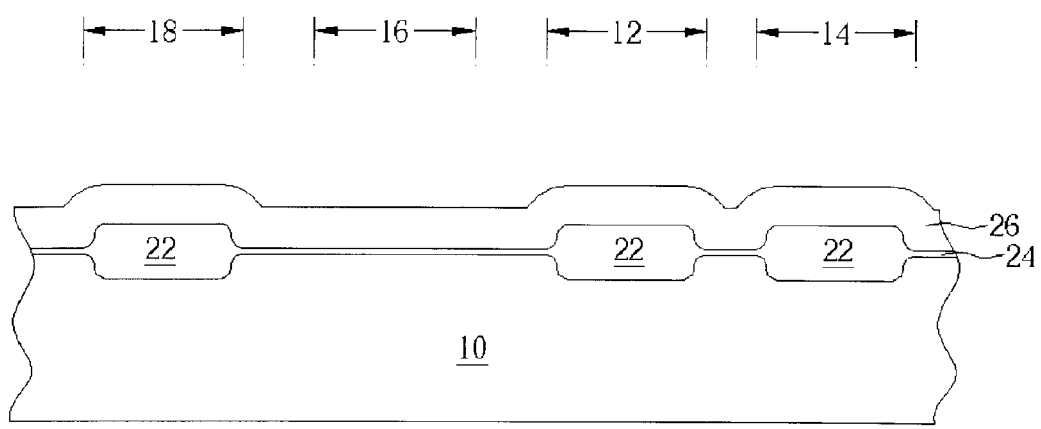
Figure 3:
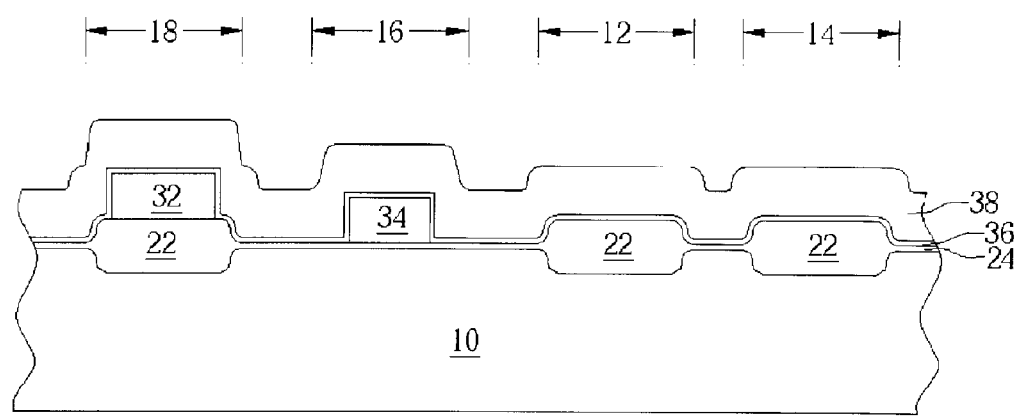
Figure 4:
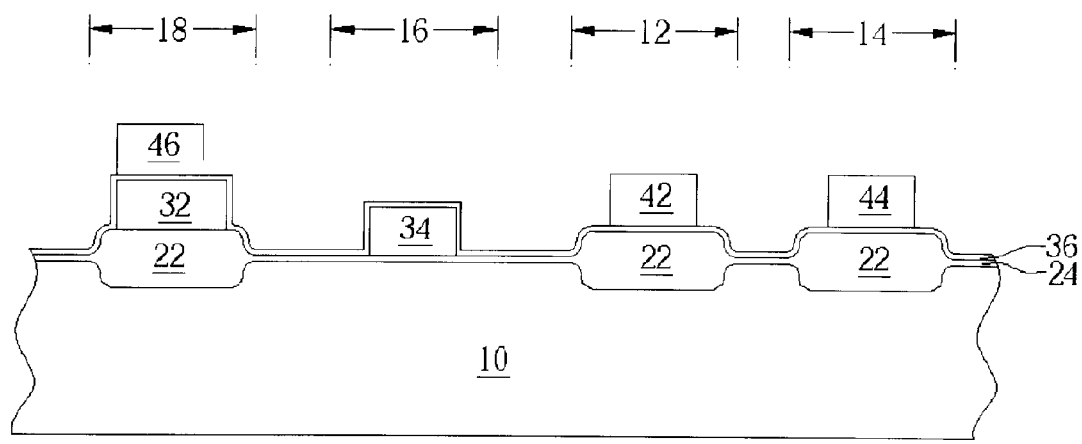
Figure 5:
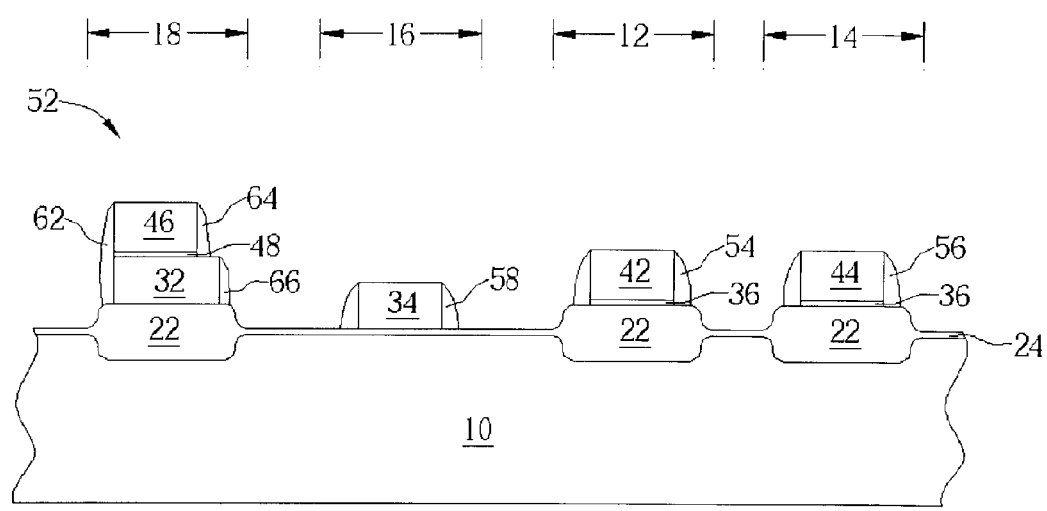
Figure 6:
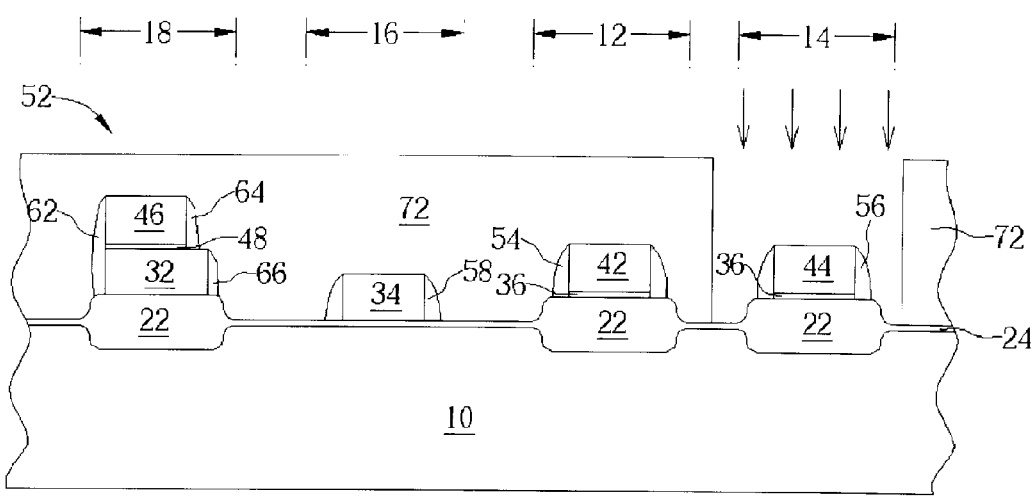
Figure 7:
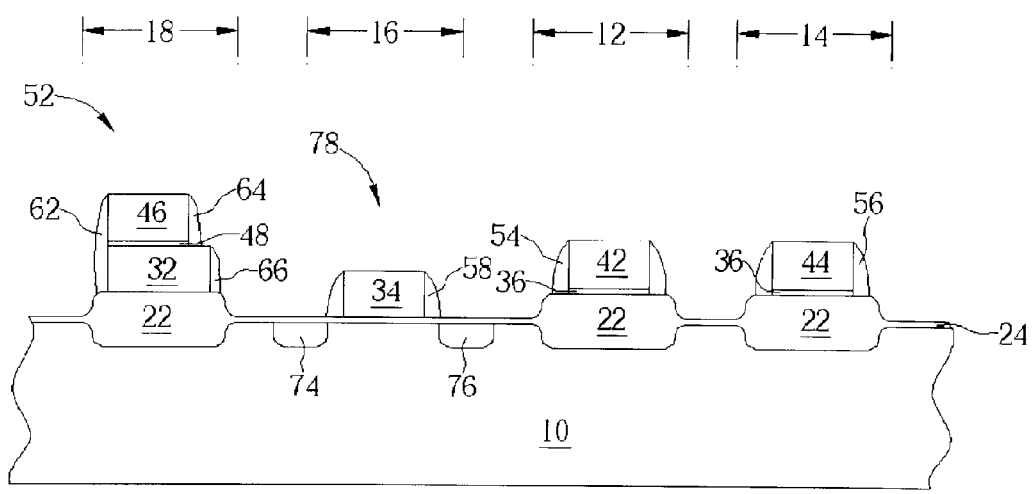
Figure 8:
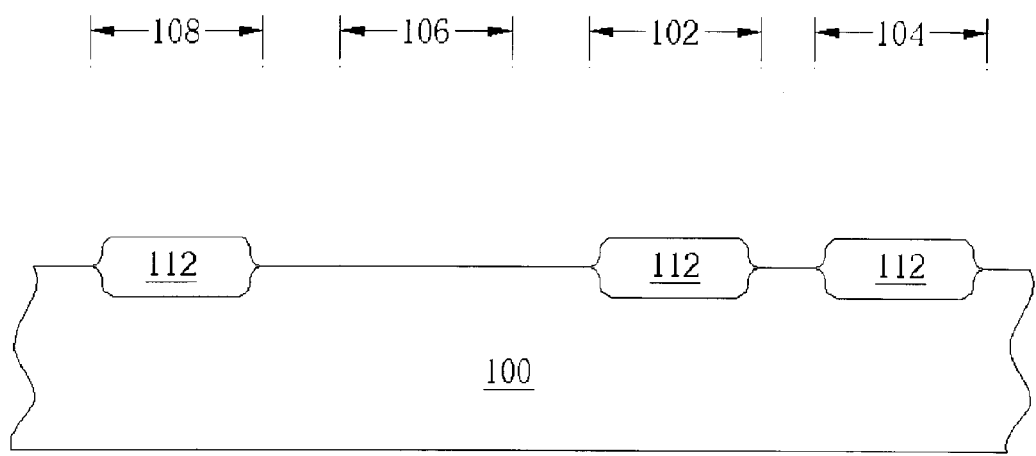
FIG. 8 to FIG. 14 are schematic diagrams illustrating a mixed-mode process according to a first preferred embodiment of the present invention method.

Please refer to FIG. 8 to FIG. 14. FIG. 8 to FIG. 14 are schematic diagrams illustrating a mixed-mode process according to a first preferred embodiment of the present invention method. As shown in FIG. 8, a semiconductor substrate 100 is provided first. The semiconductor substrate 100 has a surface comprising at least a first conductive region 102, at least a second conductive region 104, at least a metal-oxide-semiconductor (MOS) transistor region 106, and at least a capacitor region 108. Either portions of the surface of the semiconductor substrate 100 within the first conductive region 102, the second conductive region 104, or the capacitor region 108 further comprises a field oxide layer 112.

Figure 9:
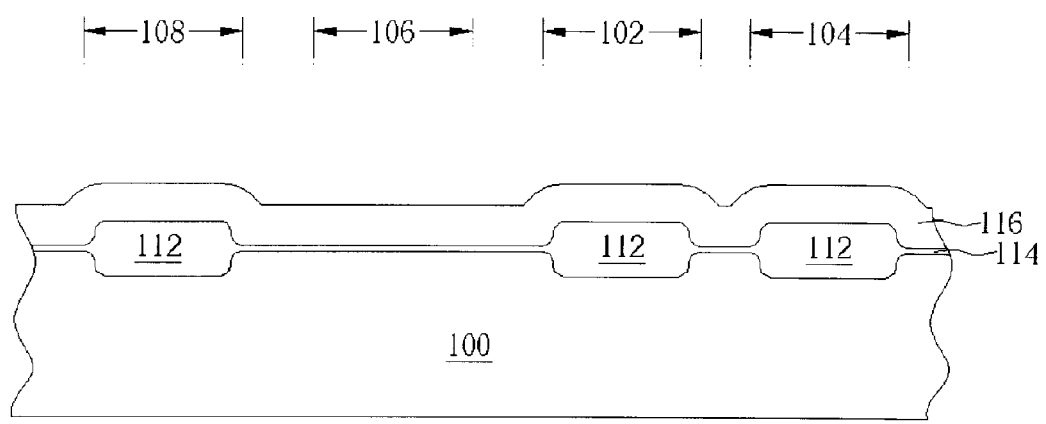

As shown in FIG. 9, a gate oxide layer 114 and a first polysilicon layer 116 are sequentially formed on the semiconductor substrate 100. The gate oxide layer 114 is formed by performing a thermal oxidation process, and the first polysilicon layer 116 is a doped polysilicon layer or an undoped polysilicon layer followed by an ionimplantation process. In addition, a silicide layer (not shown) is optionally formed on the first polysilicon layer 116. The silicide layer (not shown), composed of tungsten silicide ($WSi_x$, where x=2.2~2.3), is formed by performing a sputtering process follow by a rapid thermal process (RTP). For simplicity of description, steps employed to form the silicide layer (not shown) are neglected. The silicide layer (not shown) is thus called a polycide layer owing to the reaction between the silicide layer (not shown) and the first polysilicon layer 116.

Figure 10:
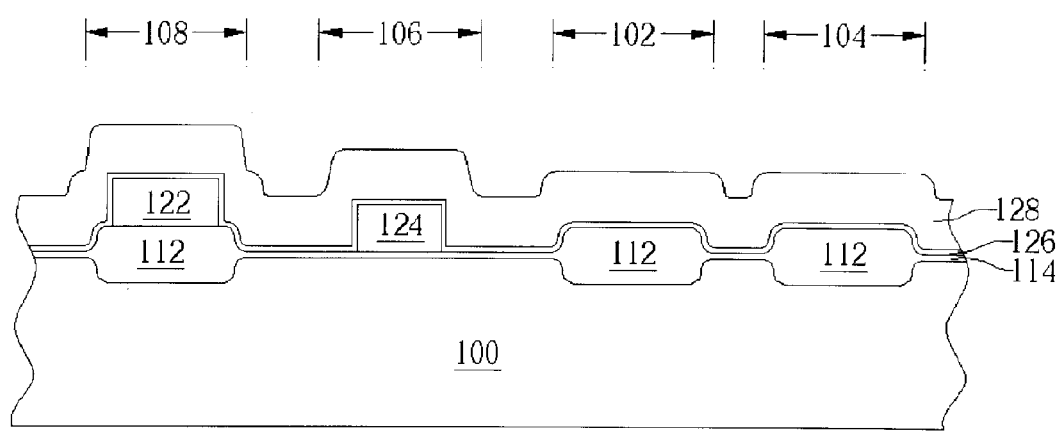

As shown in FIG. 10, a first photo-etching-process (PEP) is performed to remove portions of the silicide layer (not shown) and the first polysilicon layer 116 to simultaneously form a bottom electrode plate 122 of a capacitor (not shown) and a gate 124 of a MOS transistor (not shown) respectively within the capacitor region 108 and the MOS transistor region 106. After that, an inter polysilicon oxide (IPO) layer 126 and a second polysilicon layer 128 are sequentially formed on the semiconductor substrate 100 to cover the bottom electrode plate 122 of the capacitor (not shown) and the gate 124 of the MOS transistor (not shown). The second polysilicon layer 128 may be formed by a deposition process followed by an ion implantation process, or be formed by an in-situ doped chemical vapor deposition process. The dopants utilized in the ion implantation process may be N-type dopants, such as arsenic or phosphorus, or P-type dopants, such as boron. When the dopants are N-type, the dosage of the ion implantation process is approximately $10^{14\sim16}$ atoms/cm$^2$. When the dopants are P-type, the dosage of the ion implantation process is approximately $10^{12\sim14}$ atoms/cm$^2$. If the second polysilicon layer 128 is formed by an in-situ doped chemical vapor deposition process, a mixing gas containing phosphine ($PH_3$) or arsine ($AsH_3$) or diborane ($B_2H_6$), silane ($SiH_4$), and nitrogen ($N_2$) is added into the reaction chamber to form the doped second polysilicon layer 128 in one step such that equivalent result is achieved. Therefore, the second polysilicon layer 128 is doped with N-type dopants or P-type dopants.

Figure 11:
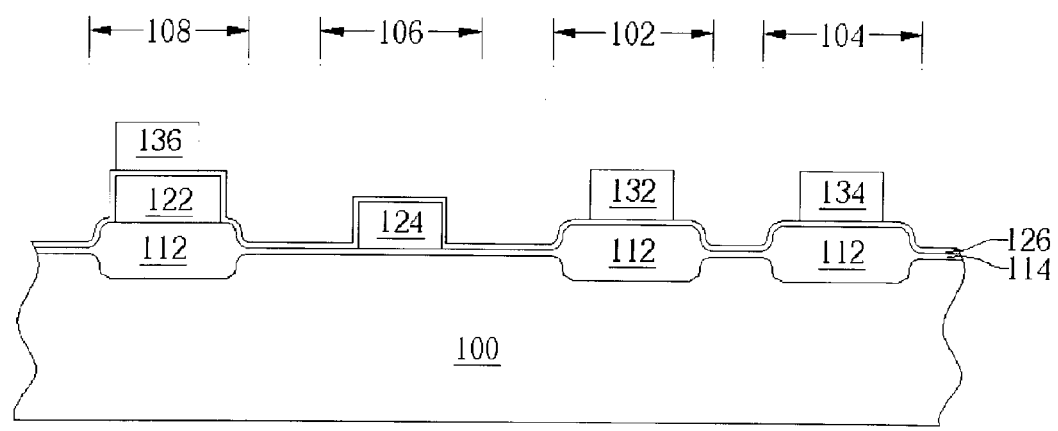
Figure 12:
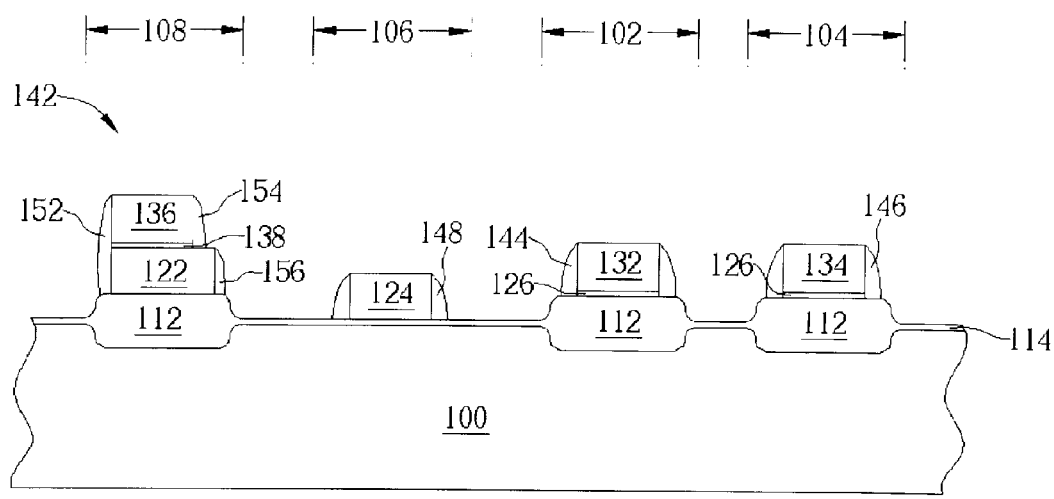

As shown in FIG. 11, a second PEP is performed to remove portions of the second polysilicon layer 128 by utilizing the IPO layer 126 as a stop layer, to simultaneously form a first conductive wire 132, a second conductive wire 134, and a top electrode plate 136 of the capacitor (not shown) respectively within the first conductive region 102, the second conductive region 104, and the capacitor region 108. The IPO layer 126 not between the bottom electrode plate 122 and the top electrode plate 136, and not below the first conductive wire 132 and the second conductive wire 134 is thereafter removed by a wet dip process, and the IPO layer 126 between the bottom electrode plate 122 and the top electrode plate 136 is employed as a capacitor dielectric layer 138 of the capacitor 142, as shown in FIG. 12. The conductive wires 132, 134 are optionally employed as resistors of the integration circuits depending on the layout of the integration circuits.

A dielectric layer (not shown), composed tetraethyloxysilane (TEOS), is formed on the semiconductor substrate 100 to cover the first conductive wire 132, the second conductive wire 134, the gate 124, and the capacitor 142. By using surfaces of the field oxide layers 112 and the gate oxide layer 114 as a stop layer, a first etching process is performed to remove portions of the dielectric layer (not shown) to form a spacer 144 on either sides of the first conductive wire 132, a spacer 146 on either sides of the second conductive wire 134, a spacer 148 on either sides of the gate 124 of the MOS transistor (not shown), a spacer 152 on one side of the capacitor 142, and spacers 154, 156 on another side of the capacitor 142. It is worth noting that the spacers 154, 156 at one side of the capacitor 142 has a different shape from the other spacers 144, 146, 148, 152 owing to the unequal widths of the bottom electrode plate 122 and the top electrode plate 136 of the capacitor 142. In addition, an ion implantation process may be performed to form a lightly doped drain (LDD, not shown) in portions of the semiconductor substrate 100 adjacent to either sides of the gate 124 before the spacers 144, 146, 148, 152, 154, 156 are formed.

Figure 13:
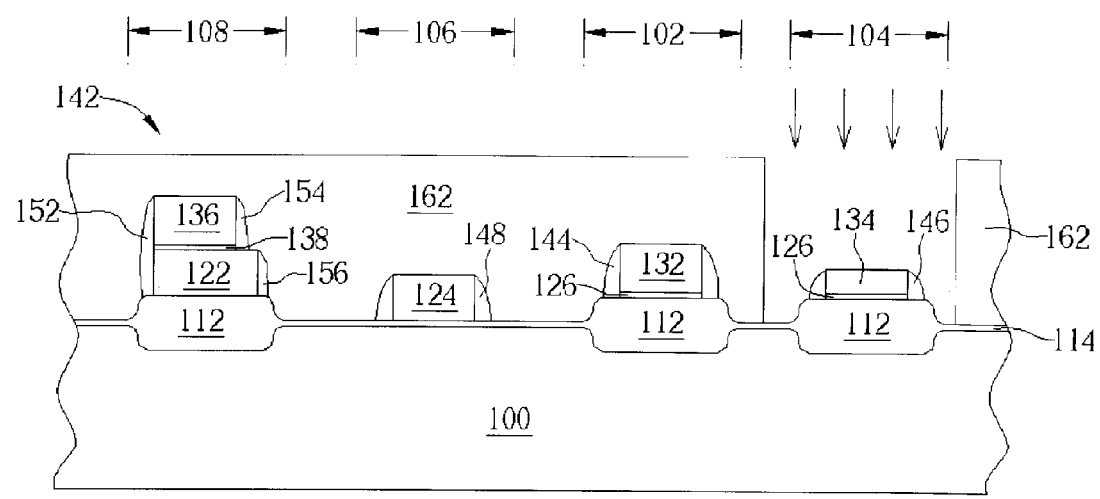

As shown in FIG. 13, a high resistance (HR) mask 162 is then formed on the semiconductor substrate 100. The HR mask 162 covers the capacitor 142, the first conductive wire 132, the gate 124 of the MOS transistor (not shown), and exposes the second conductive wire 134. After that, a second etching process is performed to remove a specific thickness of the second conductive wire 134. The method for controlling the end of the second etching process comprises using a time mode or an endpoint mode. A first ion implantation process is thereafter performed to dope the second conductive wire 134 with dopants having an opposite type to the dopants used in doping the second polysilicon layer 128. That means, the second conductive wire 134 is doped with P-type dopants, such as boron, or N-type dopants, such as arsenic or phosphorus, when the dopants used in doping the second polysilicon layer 128 are N-type or P-type, respectively. The first ion implantation process is thus called a high resistance implantation process. When the dopants are P-type, the dosage of the first ion implantation process is approximately $10^{13\sim15}$ atoms/cm$^2$. When the dopants are N-type, the dosage of the first ion implantation process is approximately $10^{13\sim15}$ atoms/cm$^2$.

Because the specific thickness of the second conductive wire 134 is removed by the second etching process, the second conductive wire 134 becomes thinner. When a thickness of the second conductive wire 134 is smaller, the cross-section area of the second conductive wire 134 becomes smaller too. Since the resistance value of a resistor is defined as:

$$R \alpha L/A$$

Where R is the resistance value of the resistor
L is the length of the resistor
A is the cross-section area of the resistor
a resistor having a high resistance value is thus formed. It is worth noting that the thinner the second conductive wire 134 is, the smaller the cross-section area of the second conductive wire 134 is to result in a higher resistance value.

Figure 14:
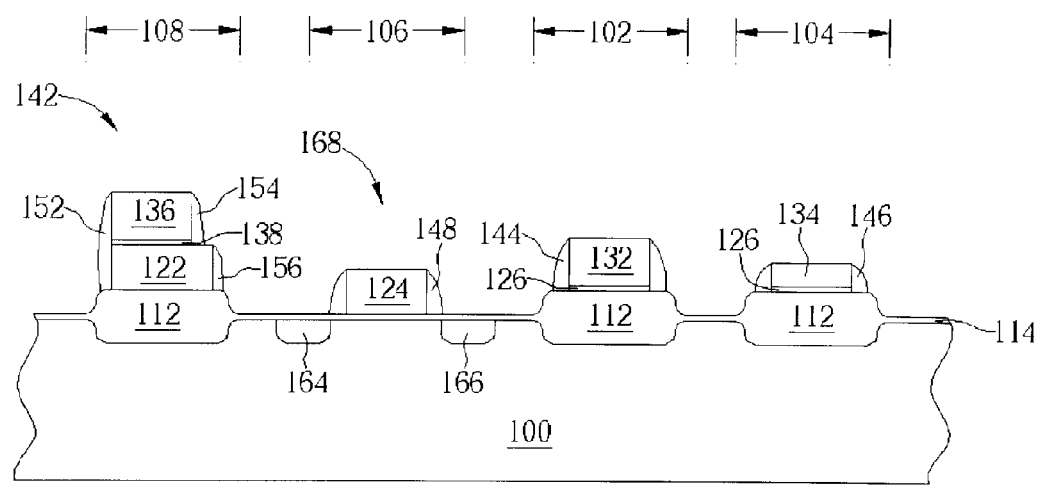

As shown in FIG. 14, the HR mask 162 is removed. After that, a source 164 and a drain 166 of the MOS transistor 168 are formed in portions of the semiconductor substrate 100 adjacent to but not contiguous to either sides of the gate 124, by performing a second implantation process, to complete the fabricating of the MOS transistor 168.

Figure 15:
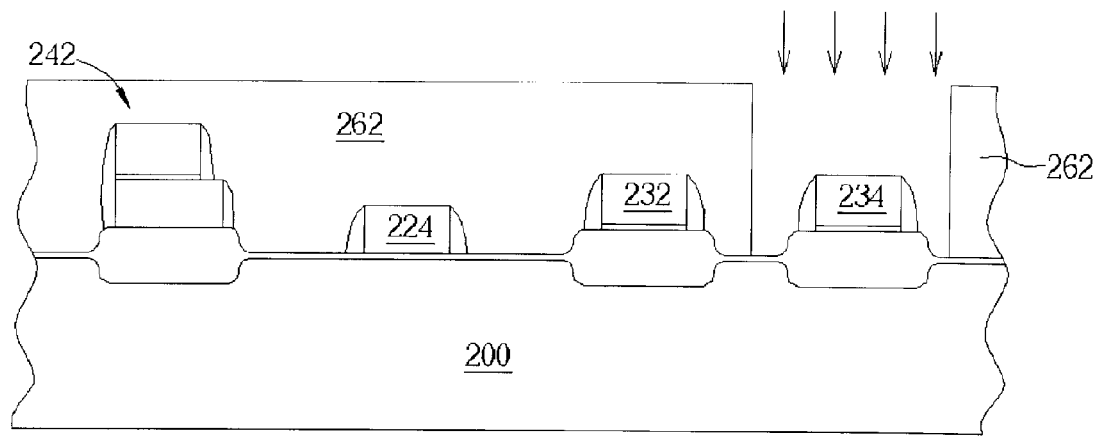
FIG. 15 to FIG. 16 are schematic diagrams illustrating a mixed-mode process according to a second preferred embodiment of the present invention method.
Figure 16:
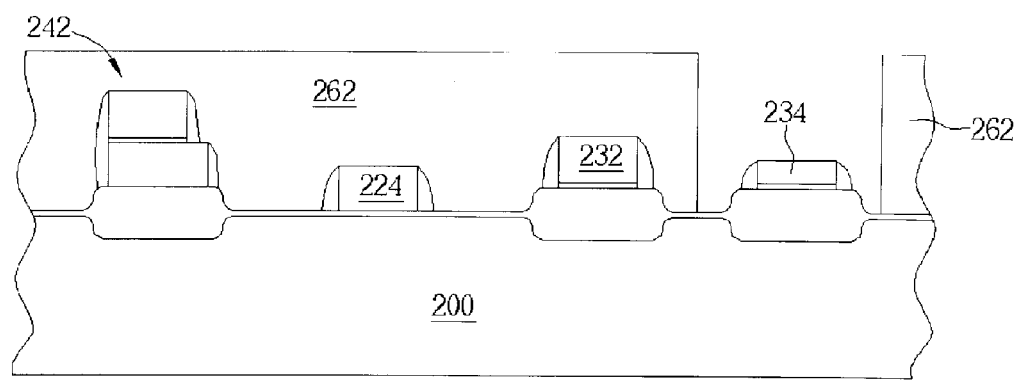

Actually, the sequence of the etching process for removing a specific thickness of the second polysilicon layer and the HR implantation process may be exchanged. Please refer to FIG. 15 to FIG. 16. FIG. 15 to FIG. 16 are schematic diagrams illustrating a mixed-mode process according to a second preferred embodiment of the present invention method. Since the process steps before the formation of the HR mask in this preferred embodiment is the same as those in the first preferred embodiment, they are not mentioned redundantly. As shown in FIG. 15, a high resistance mask 262 is formed on the semiconductor substrate 200. The HR mask 262 covers the capacitor 242, the first conductive wire 232, the gate 224 of the MOS transistor (not shown), and exposes the second conductive wire 234. A first ion implantation process is thereafter performed to dope the second conductive wire 234 with dopants having an opposite type to the dopants used to dope the second polysilicon layer (not shown), and the second conductive wire 234 is formed by etching the second polysilicon layer (not shown). That means, the second conductive wire 234 is doped with P-type dopants, such as boron, or N-type dopants, such as arsenic or phosphorus, when the dopants used in doping the second polysilicon layer (not shown) are N-type or P-type, respectively. The first ion implantation process is thus called a high resistance implantation process. When the dopants are P-type, the dosage of the first ion implantation process is approximately $10^{13 \sim 15}$ atoms/cm$^2$. When the dopants are N-type, the dosage of the first ion implantation process is approximately $10^{13 \sim 15}$ atoms/cm$^2$.

After that, a second etching process is performed to remove a specific thickness of the second conductive wire 234, as shown in FIG. 16. The method for controlling the end of the second etching process comprises using a time mode or an endpoint mode. Since the specific thickness of the second conductive wire 234 is removed by the second etching process, the second conductive wire 234 becomes thinner. When a thickness of the second conductive wire 234 is smaller, the cross-section area of the second conductive wire 234 becomes smaller too. Therefore, a resistor having a high resistance value is thus formed. The HR mask 262 is then removed and a source and a drain of the MOS transistor are formed (not shown in FIG. 16).

According to the present invention mixed-mode process, a specific thickness of the second conductive wire is removed by utilizing the HR mask as a mask. Therefore, the cross-section area of the second conductive wire becomes smaller to result in a resistor having an obviously higher resistance value without adding any mask and photolithography step. When applying the present invention mixed-mode process to a practical production line, resistors being able to fulfill the requirements for various modern circuit designs are fabricated. In addition, the process complexity is not increased. The cost is not lifted.

In comparison with the prior art, the present invention provides a mixed-mode process to remove a specific thickness of the second conductive wire without adding any mask and photolithography step. The thickness of the second conductive wire thus becomes smaller, leading to a smaller cross-section area of the second conductive wire. As a result, the second conductive wire becomes a resistor having a high resistance value. By adjusting the final thickness of the second conductive wire in conjunction with the dosage and/or implant energy of the high resistance implantation process, the ideal resistance value can be achieved. According to the present invention mixed-mode process, a high resistance resistor having a double or even higher resistance value of that of the prior art is fabricated, although the HR implantation process cannot effectively neutralize the dopants already existing in the second conductive wire. In addition, the dosage and/or the implant energy of the HR implantation process can be reduced to avoid processing problems caused by high implant dosage and high implant energy.

Those skilled in the art will readily observe that numerous modifications and alterations of the device may be made while retaining the teachings of the invention. Accordingly, the above disclosure should be construed as limited only by the metes and bound of the appended claims.

What is claimed is:

1. A mixed-mode process for integration circuits comprising:

providing a semiconductor substrate, a surface of the semiconductor substrate comprising at least a first conductor formed in a first conductive region, at least a second conductor formed in a second conductive region, at least a metal-oxide-semiconductor (MOS) transistor formed in a MOS transistor region, and at least a capacitor formed in a capacitor region;

forming a mask on the semiconductor substrate to cover the MOS transistor, the first conductor, and the capacitor and to expose the second conductor;

performing a first etching process to remove a specific thickness of the second conductor; and performing a first ion implantation process to dope the second conductor with first type dopants;

wherein the order of the first etching process and the first ion implantation process can be switched.

2. The mixed-mode process of claim 1 further comprising the following steps for forming the first conductor, the second conductor, the MOS transistor, and the capacitor:

sequentially forming a gate oxide layer and a first polysilicon layer on the semiconductor substrate;

performing a first photo-etching-process (PEP) to remove portions of the first polysilicon layer to simultaneously form a gate structure and a bottom electrode plate structure of the capacitor respectively in the MOS transistor region and the capacitor region;

sequentially forming an inter polysilicon oxide (IPO) layer and a second polysilicon layer doped with second type dopants on the semiconductor substrate to cover the gate structure and the bottom electrode plate structure;

performing a second PEP to remove portions of the second polysilicon layer to form the first conductor, the second conductor, and a top electrode plate of the capacitor, respectively, in the first conductive region, the second conductive region, and the capacitor region;

forming a dielectric layer on the semiconductor substrate to cover the first conductor, the second conductor, the gate structure, and the capacitor; and performing a second etching process to remove portions of the dielectric layer to form a spacer on either sides of the first conductor, the second conductor, the capacitor, and the gate structure.

3. The mixed-mode process of claim 2 wherein the first polysilicon layer is a doped polysilicon layer or an undoped polysilicon layer followed by an ion implantation process.

4. The mixed-mode process of claim 2 wherein a polycide layer is formed before performing the first PEP process, and portions of the polycide layer is removed by the first PEP process.

5. The mixed-mode process of claim 4 wherein portions of the first polysilicon layer and the polycide layer in the gate structure is employed as a gate of the MOS transistor of the integration circuits.

6. The mixed-mode process of claim 4 wherein portions of the first polysilicon layer and the polycide layer in the bottom electrode plate structure is employed as a bottom electrode plate of the capacitor.

7. The mixed-mode process of claim 4 wherein the polycide layer comprises tungsten silicide.

8. The mixed-mode process of claim 2 wherein the first type dopants are N-type dopants and the second type dopants are P-type dopants.

9. The mixed-mode process of claim 2 wherein the first dopants are P-type dopants and the second type dopants are N-type dopants.

10. The mixed-mode process of claim 2 wherein the second PEP utilizes the IPO layer as a stop layer.

11. The mixed-mode process of claim 2 wherein a wet dip process is performed after the second PEP to remove portions of the IPO layer and to preserve the IPO layer between the bottom electrode plate structure and the top electrode plate employed as a capacitor dielectric layer of the capacitor.

12. The mixed-mode process of claim 2 wherein the dielectric layer comprises tetra-ethyloxysilane (TEOS).

13. The mixed-mode process of claim 2 wherein either portions of the surface of the semiconductor substrate within the first conductive region, the second conductive region, or the capacitor region comprise a field oxide layer, and surfaces of the field oxide layer and the gate oxide layer are employed as a stop layer for the second etching process used for the formation of the spacers.

14. The mixed-mode process of claim 1 wherein the conductors in the first conductive region and the second conductive region are employed as resistors of the integration circuits, and the mask is a high resistance (HR) mask.

15. The mixed-mode process of claim 1 wherein the method for controlling the end of the first etching process comprises using a time mode or an endpoint mode.

16. The mixed-mode process of claim 1 wherein a second ion implantation process is performed to form a source and a drain of the MOS transistor in portions of the semiconductor substrate adjacent to either sides of the gate structure.

* * * * *